Figure 1:
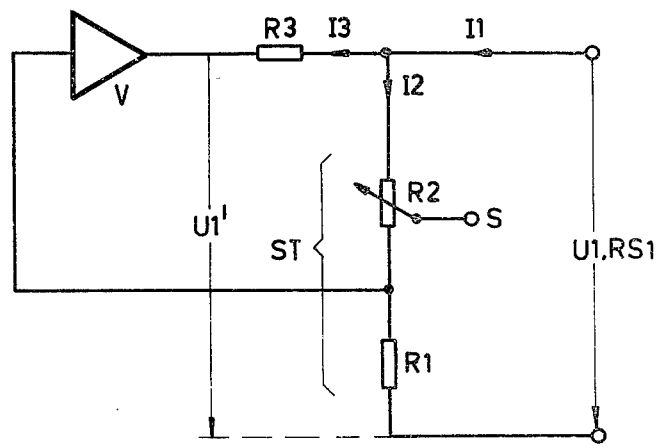

United States Patent [19]

Schemmel et al.

[11] 4,137,466
[45] Jan. 30, 1979

[54] CONTROLLABLE ELECTRONIC RESISTANCE DEVICE

[75] Inventors: Hans R. Schemmel; Ingo Reichelt, both of Nuremberg, Fed. Rep. of Germany

[73] Assignee: U.S. Philips Corporation, New York, N.Y.

[21] Appl. No.: 858,266

[22] Filed: Dec. 7, 1977

[30] Foreign Application Priority Data

Dec. 7, 1976 [DE] Fed. Rep. of Germany ....... 2655320

[51] Int. Cl.² .............................................. H03K 1/14
[52] U.S. Cl. ..................................... 307/264; 330/86; 330/282; 333/80 T
[58] Field of Search ................. 330/86, 107, 109, 145, 330/282, 283, 284; 307/264; 333/80 R, 80 T

[56] References Cited

U.S. PATENT DOCUMENTS

| | | | |
|---|---|---|---|
| 3,539,826 | 11/1970 | Crouse | 330/284 X |
| 4,001,735 | 1/1977 | Cheng et al. | 333/80 R |

FOREIGN PATENT DOCUMENTS 1927588 12/1970 Fed. Rep. of Germany ........... 330/282

OTHER PUBLICATIONS

"Simulated Inductance for Low Frequency Filter", Electronic Engineering, Nov. 1976, p. 19.

*Primary Examiner*—James B. Mullins
*Attorney, Agent, or Firm*—Frank R. Trifari; Simon L. Cohen

[57] ABSTRACT

A variable resistance device utilizes a control signal variable resistor and a first fixed resistor connected in series as a voltage divider as well as a second fixed resistor and an operational amplifier having an input connected between the first fixed resistor and one side of the variable resistor and an output connected through the second fixed resistor to the other side of the variable resistor, as a substantially linear variable resistance device where the variable resistance is obtained across the voltage divider.

6 Claims, 4 Drawing Figures

CONTROLLABLE ELECTRONIC RESISTANCE DEVICE

The invention relates to an electronic resistance device including means for varying the resistance value in accordance with an applied control signal.

Controllable electronic resistance devices are particularly useful as adjusting members in amplifier gain control circuits. In many applications, for example, in gain control circuits of transmission line amplifiers it is required that the adjusting member provides a substantially linear control over a wide control range so as to ensure a distortion-free transmission of the signal with its intermittently occurring voltage peaks. In order applications, for instance, in the receiving circuits of data modems, the control circuit including adjusting member is furthermore required to be sufficiently sensitive to give a fast response.

Electronic resistance devices may be implemented with diodes having an adjustable operating point. However, for most applications the control range is too limited with these devices because of the nonlinearity of the diode characteristic. This also applies to devices in which the controllable electronic resistance is formed by the emitter-collector path of a transistor. A wider control range can be achieved with a device formed by an externally heated thermistor. In many cases, however, the thermistor cannot be used due to the high thermal time constant of the thermistor and the resulting slow response of the control circuit.

It is the object of the invention to provide a controllable electronic resistance device permitting linear control over a wide control range and having a low control time constant.

In accordance with the object set forth above, the present invention provides an improved electronic resistance device comprising an amplifier having an input and an output, a first and a second terminal, a voltage divider including a first and a second resistor connected in series between said first and second terminal, means connecting the amplifier input to the junction of said first and second resistors, and a third resistor connecting the amplifier output to said first terminal, said second resistor being adjustable in response to an applied control signal so as to thereby adjust the value of the electronic resistance device.

Figure 2:
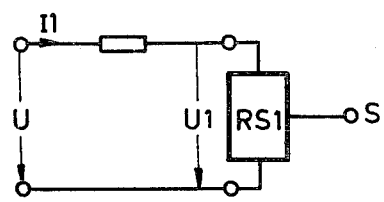
Figure 3:
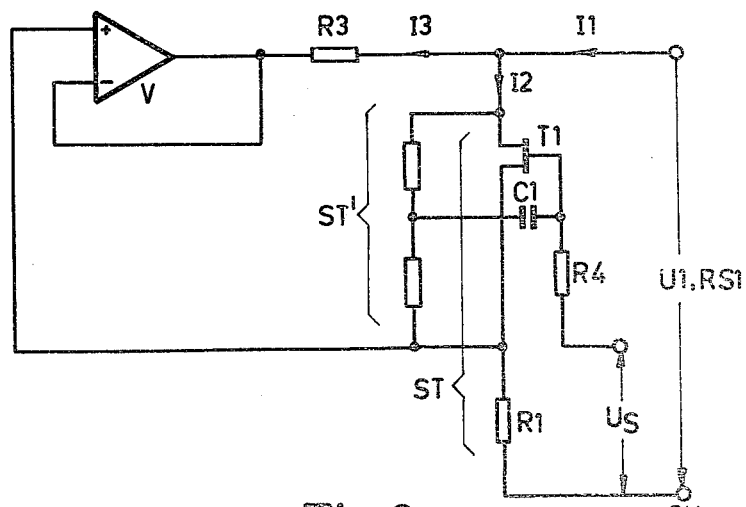
Figure 4:
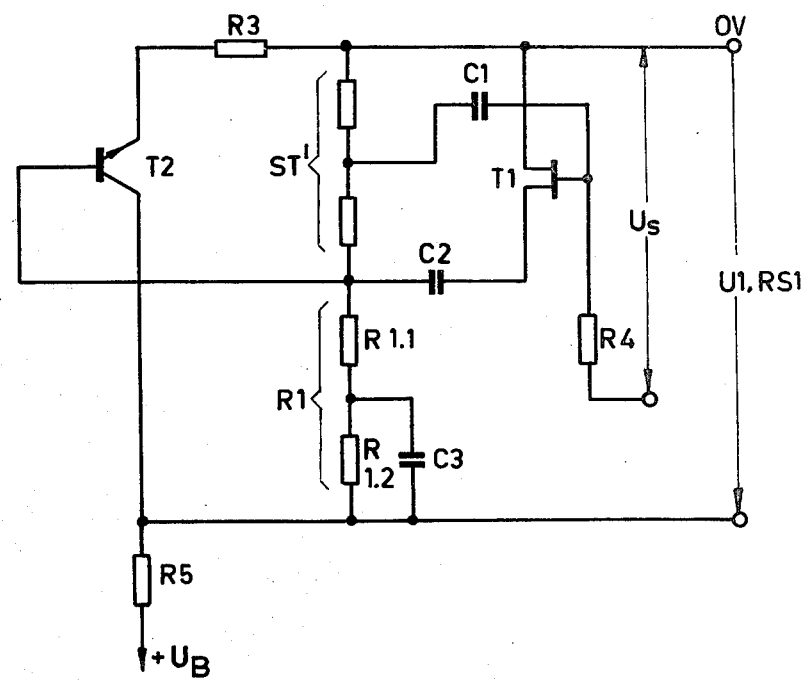

The invention will now be explained in greater detail with reference to the drawing, in which:

FIG. 1 shows schematically the electronic resistance device according to the invention, FIG. 2 is an example in which the device according to the invention is used as part of a circuit, FIG. 3 shows a possible embodiment of the device according to the invention, FIG. 4 shows the circuit arrangement of a further embodiment according to the invention.

In FIG. 1 a voltage divider ST is formed by the series arrangements of a first resistor R1 and a second resistor R2. The second resistor R is adjustable in response to a control signal S. The junction of resistor R1 and resistor R2 is connected to the input of an amplifier V. The output of amplifier V is connected via the resistor R3 to the free end of the resistor R2. The required electronic resistance RS1 is produced between the two ends of the voltage divider ST.

For an easier understanding the following explanation of the invention it will be assumed that the current I2 flowing through the voltage divider ST is low relative to the current I1 flowing through the electronic resistance RS1, so that this current I1 is substantially equal to the current I3 flowing through the resistor R3 and that the internal resistance of the amplifier V is negligibly small relative to the value of the resistor R3. If a sinusoidal a.c. voltage U1 is connected to the electronic resistance RS1, an a.c. voltage $U1' = ü \cdot U1$ is produced at the output of the amplifier V, where the factor ü is obtained from the division ratio of the voltage divider ST as well as from the input resistance and the gain of the amplifier V. The a.c. voltage across the resistor R3 is equal to the difference between the a.c. voltages U1 and U1' and may be written as $U1 - ü \cdot U1 = U1 \cdot (1 - ü)$. The current $I_3$ flowing through the resistor R3 can therefore be determined from the ratio of this differential voltage to the value of the resistor R3:

$$I3 = [U1 \cdot (1 - ü)/R3] \approx I1 \tag{1}$$

From this equation the value of the electronic resistance RS1 can be calculated as $$RS1 = (U1/I1) \sim (R3/1-ü) \tag{2}$$

From this it follows that the electronic resistance RS1 can be controlled by changing the factor ü. In its turn the factor ü can be controlled by changing the control parameter S.

An advantageous embodiment consists in that the emitter-collector path of a transistor is used as controllable second resistance R2, wherein the resistance of this path is controlled by means of the base bias voltage. Only a part of the voltage U1 occurring at the electronic resistance RS1 is connected to this emitter-collector path. The circuit arrangement according to the invention has therefore the advantage that the values for the overload limit and the attenuation of the non-linear distortion are considerably higher than in the cases mentioned in the preamble, in which the voltage U1 is connected directly to the emitter-collector path of a transistor or to the cathode-anode-path of a diode respectively.

If the electronic resistance RS1 is connected into a circuit, as shown in FIG. 2, for example in the feedback circuit of an amplifier, a greater voltage drop is produced at this resistance in the case of high resistance values. From the equation (2) for the electronic resistance RS1 it follows that with high positive values of RS1 the factor ü has a value which is somewhat lower than unity. This means that a transistor which is used as the second resistor R2 is in its low-ohmic state. This behavior is a further advantage compared with the circuits mentioned in the preamble in which, in a high-ohmic state, also the relevant transistor or diode respectively is in the high-ohmic and, consequently, in the particularly overload-sensitive state.

In the embodiment shown in FIG. 3 the amplifier V is implemented with an integrated operational amplifier, the voltage gain of the amplifier having the value $v = +1$. As controllable second resistor R2 the field effect transistor T1 is used whose gate electrode is connected across the ohmic resistor R4 to the control voltage source $U_s$, which serves as control parameter S. The ohmic voltage divider ST' is arranged in parallel with the source-drain path of the transistor T1, the capacitor C1 being arranged between the tap of this voltage divider and the gate electrode of transistor T1. Together with the voltage divider ST' and the resistor R4 this capacitor C1 is used as feedback for transistor T1 and, consequently, to increase the attenuation of the non-linear distortion. The electronic resistance RS1 is controlled by changing the control voltage $U_s$. The limit of the control range of the electronic resistance RS1 can be influenced with the resistance of the voltage divider ST'. If no voltage divider ST' is required, a single resistor can alternatively be used instead of the voltage divider ST' for influencing the control range. An ohmic resistor is used as resistor R3. In accordance with equation (2) the values of the electronic resistance RS1 are then the actual values.

In a further embodiment of the invention the resistor R3 is a complex resistor. A complex resistance is then also obtained for the electronic resistance RS1. As follows from equation (2), this resistance RS1 depends only on the value of the real factor u. The complex resistance RS1 has therefore the same phase angle as the complex resistor R3. If, for example, an inductance is used as resistor $R_3$, a corresponding variable inductance occurs at electronic resistance RS1. With this embodiment of the invention it is, for example, possible to control the resonant frequency of an LC resonant circuit over a wide range.

FIG. 4 shows a further embodiment of the invention. Here the amplifier V is realized with the npn-transistor T2, the emitter of which constitutes the amplifier output and the base the amplifier input. The junction of the resistor R3, which is in the form of an ohmic resistor, and the voltage divider ST' and the source-drain path of transistor T1 is connected to one pole of a direct voltage source $U_B$ (voltage OV) and constitutes again one terminal of the electronic resistance RS1. The resistor R1 is formed by the series arrangement of the two ohmic resistors R1.1 and R1.2, the latter being arranged in parallel with the capacitor C3. The junction of the collector of transistor T2, capacitor C3, resistor R1.2 and one end of the resistor R5 forms the other terminal of the electronic resistance RS1. The other end of the resistor R5 is connected to the other, in this case positive pole of the direct voltage source $U_B$. The series arrangement of the source-drain path of transistor T1 with the capacitor C2 is between voltage OV and the junction of voltage divider ST', resistor R1.1 as well as the base of the transistor T2. Furthermore, the ohmic resistor R3 together with the resistors R1.1, R1.2 and R5 as well as the voltage divider ST' are used for adjusting the operating point of the transistor T2. The capacitor C3 shortcircuits the resistor R1.2 for alternating current. By means of a corresponding choice of the ratio of the resistors R1.1 and R1.2 an additional adjusting possibility for the factor ü or for the control range of the electronic resistance RS1 respectively is obtained. A complex resistor can also be used instead of the ohmic resistor R3. In that case a certain direct current resistance must then be taken into account in view of the operating point of the transistor T2.

As individual transistors have a high cutt-off frequency relative to operational amplifiers, the embodiment of FIG. 4 is particularly suitable for high frequencies.

In the general case shown in FIG. 1, the resistor R1 and the controllable second resistor R2 can be interchanged.

It is also possible to use, for example, a phototransistor or a field plate as controllable second resistor R2. The control parameter S for controlling the electronic resistance RS1 is then a light source or a magnetic field respectively.

If the input resistance of the amplifier V is rated correspondingly low, the resistor R1 can be omitted.

What is claimed is:

1. An electronic resistance device comprising an amplifier having an input and an output, a first and a second terminal means for applying an input voltage, a voltage divider including a first resistor and a second resistor connected in series between said first and second terminal, means connecting the amplifier input to the junction of said first and second resistors, and a third resistor connecting the amplifier output to said first terminal, said second resistor being adjustable in response to an applied control signal so as to thereby adjust the value of the electronic resistance device between said first and second terminals.

2. An electronic resistance device as claimed in claim 1, wherein the controllable second resistance is formed by the emitter-collector path of a transistor whose base electrode is connected via a fourth resistor to a control voltage source.

3. An electronic resistance device as claimed in claim 2, wherein arranged in parallel with the emitter-collector path of the transistor there is an additional voltage divider between whose tap and the base electrode a capacitor is connected.

4. An electronic resistance device as claimed in claim 1, wherein the controllable second resistance is formed by the source-drain path of a field effect transistor whose gate electrode is connected via a fourth resistor (R4) to a control voltage source.

5. An electronic resistance device as claimed in claim 4 further comprising an additional voltage divider connected in parallel with the source-drain path of the transistor and provided with a tap, and a capacitor connected between the tap of the additional voltage divider and the gate electrode of the transistor.

6. An electronic resistance device as claimed in any of the claims 1, wherein the third resistor at the output of the amplifier is a complex resistor.

* * * * *